(12) United States Patent
Clevenger et al.

(10) Patent No.: US 11,049,727 B2
(45) Date of Patent: Jun. 29, 2021

(54) INTERLEAVED STRUCTURE FOR MOLECULAR MANIPULATION

(71) Applicant: International Business Machines Corporation, Armonk, NY (US)

(72) Inventors: Lawrence A. Clevenger, Saratoga Springs, NY (US); Shawn Peter Fetterolf, Cornwall, VT (US); Donald Canaperi, Bridgewater, CT (US); Kangguo Cheng, Schenectady, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/429,277

(22) Filed: Jun. 3, 2019

(65) Prior Publication Data

US 2020/0381259 A1    Dec. 3, 2020

(51) Int. Cl.
*H01L 21/308* (2006.01)
*H01L 21/02* (2006.01)

(52) U.S. Cl.
CPC .... *H01L 21/3081* (2013.01); *H01L 21/02592* (2013.01)

(58) Field of Classification Search
CPC .................. H01L 21/3081; H01L 21/02592
See application file for complete search history.

(56) References Cited

U.S. PATENT DOCUMENTS

| | | | |
|---|---|---|---|
| 5,795,782 A | 8/1998 | Church et al. | |
| 6,099,803 A | 8/2000 | Ackley et al. | |
| 7,250,074 B2 | 7/2007 | Tonkovich et al. | |
| 7,604,781 B2 | 10/2009 | Brophy et al. | |
| 7,704,726 B2 | 4/2010 | Heller et al. | |
| 8,183,648 B2 | 5/2012 | Krstic et al. | |
| 8,974,652 B2 | 3/2015 | Gascoyne et al. | |
| 9,536,721 B2 | 1/2017 | Berdnikov et al. | |
| 2004/0011651 A1 | 1/2004 | Becker et al. | |
| 2004/0058423 A1 | 3/2004 | Albritton et al. | |
| 2008/0187915 A1 | 8/2008 | Polonsky et al. | |
| 2008/0203502 A1 | 8/2008 | Heller et al. | |
| 2015/0001084 A1 | 1/2015 | Peter et al. | |
| 2016/0067706 A1 | 3/2016 | Molho et al. | |

(Continued)

FOREIGN PATENT DOCUMENTS

| WO | 03/099439 A1 | 12/2003 |
|---|---|---|
| WO | 2004/050243 A1 | 6/2004 |

OTHER PUBLICATIONS

Clevenger et al.; "Manipulation of a Molecule Using Dipole Moments"; U.S. Appl. No. 16/448,264, filed Jun. 21, 2019.

(Continued)

*Primary Examiner* — Vongsavanh Sengdara

(74) *Attorney, Agent, or Firm* — Cantor Colburn LLP; Kristofer Haggerty

(57) ABSTRACT

A semiconductor structure is provided. A non-limiting example of the structure includes a substrate and a plurality of first pillars of a conductive material above a first portion of the substrate. The structure further includes a plurality of second pillars of the conductive material above a second portion of the substrate, wherein the plurality of first pillars are offset by a gap distance from the plurality of second pillars along a longitudinal axis.

13 Claims, 16 Drawing Sheets

(56) References Cited

U.S. PATENT DOCUMENTS

| | | |
|---|---|---|
| 2016/0199853 A1 | 7/2016 | Harwood et al. |
| 2017/0326558 A1 | 11/2017 | Mahshid et al. |
| 2018/0037456 A1 | 2/2018 | Drexler |
| 2019/0371655 A1* | 12/2019 | Hsiao ............... H01L 21/76877 |
| 2020/0105603 A1* | 4/2020 | Chang ............... H01L 21/76895 |
| 2020/0105870 A1* | 4/2020 | Ching ............... H01L 29/66795 |
| 2020/0259014 A1* | 8/2020 | Ching ............... H01L 29/66795 |

OTHER PUBLICATIONS

Davis et al.; "Simulations for guiding the delivery and trapping of single biomolecules in a nanofluidic device"; SPIEDigitalLibrary.org/conference-proceedings-of-spie (2010); 10 pages.

Leanhardt et al.; "High-Resolution Spectroscopy on Trapped Molecular Ions in Rotating Electric Fields: A New Approach for Measuring the Electron Electric Dipole Moment"; University of Colorado, Boulder—Physics Faculty Contributions (2011); 41 pages.

List of IBM Patents or Patent Applications Treated as Related; Date Filed: Jun. 21, 2019, 2 pages.

Niiitsu et al.; "Development of Microelectrode Arrays Using Electroless Plating for CMOS-Based Direct Counting of Bacterial and HeLa Cells"; IEEE Transactions on Biomedical Circuits and Systems, vol. 9, No. 5; Oct. 2015; 13 pages.

Yousuff et al.; "Microfluidic Platform for Cell Isolation and Manipulation Based on Cell Properties"; MDPI—micromachines, www.mdpi.com/journal/micromachines; Jan. 4, 2017; 26 pages.

* cited by examiner

INTERLEAVED STRUCTURE FOR MOLECULAR MANIPULATION

BACKGROUND

The present invention generally relates to semiconductor structures, and more specifically, to an interleaved structure for molecular manipulation.

There is an ever increasing use of semiconductors to control the placement and orientation of molecules using dipole moments. This is being performed at the molecular scale. Molecular control is used in order to support different applications, such as customized medicine and specific dosing. However, molecular manipulation using semiconductor structures is challenging and difficult.

SUMMARY

Embodiments of the present invention are directed to a method of forming a semiconductor structure. A non-limiting example of the method includes forming a mandrel including first pillars of a first material on a substrate. The method deposits spacers including a second material along sidewalls of the first pillars and deposits the first material between the spacers. The method removes the first material from a first portion of the structure forming first gaps and removes the second material from a second portion of the structure forming second gaps. The method forms a partially interleaved structure of alternating second material in the first portion and first material in the second portion. The method also deposits a conductor in the first gaps and the second gaps.

Embodiments of the present invention are directed to a semiconductor structure. A non-limiting example of the structure includes a substrate and a plurality of first pillars of a conductive material above a first portion of the substrate. The structure further includes a plurality of second pillars of the conductive material above a second portion of the substrate, wherein the plurality of first pillars are offset by a gap distance from the plurality of second pillars along a longitudinal axis.

Embodiments of the present invention are directed to a method of manipulating a molecule. A non-limiting example of the method includes providing a semiconductor structure having a plurality of first interleaved, adjacent electrodes forming a nanochannel. The method applies a voltage to one or more of the plurality of interleaved, adjacent electrodes to create an electric field and manipulates a molecule in the nanochannel using the electric field.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

Figure 1:
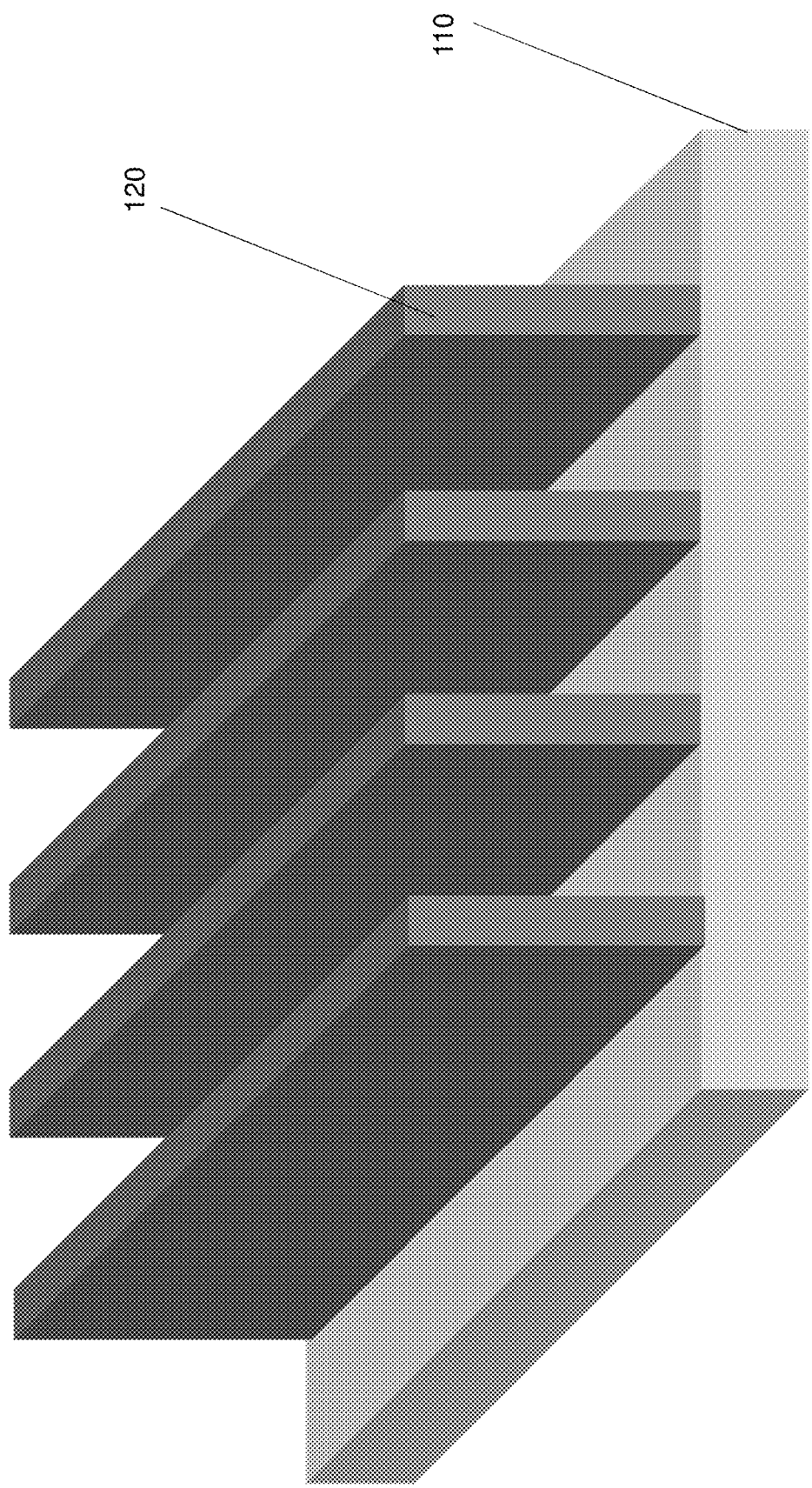
FIG. 1 depicts a cross-sectional view of a semiconductor structure after a processing operation according to one or more embodiments of the present invention.

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

Various embodiments of the invention are described herein with reference to the related drawings. Alternative embodiments of the invention can be devised without departing from the scope of this invention. Various connections and positional relationships (e.g., over, below, adjacent, etc.) are set forth between elements in the following description and in the drawings. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. Moreover, the various tasks and process steps described herein can be incorporated into a more comprehensive procedure or process having additional steps or functionality not described in detail herein.

For the sake of brevity, conventional techniques related to making and using aspects of the invention may or may not be described in detail herein. In particular, various aspects of computing systems and specific computer programs to implement the various technical features described herein are well known. Accordingly, in the interest of brevity, many conventional implementation details are only mentioned briefly herein or are omitted entirely without providing the well-known system and/or process details.

Turning now to an overview of technologies that are more specifically relevant to aspects of the invention, there is a growing use of semiconductors to control the placement and orientation of molecules at the molecular scale. Molecular control is used in order to support different applications, such as customized medicine and specific dosing. However, the ability to control the placement and orientation of molecules has proven to be quite difficult. In the past, there has been scant ability to do so at the molecular scale or with any degree of precision.

Turning now to an overview of the aspects of the invention, one or more embodiments of the invention address the above-described shortcomings of the prior art by providing a 3D structure that exploits the dipole within a molecule. In particular, a 3D structure is provided that provides for offset field generation that permits that movement and change in orientation of a molecule by using the dipole of the molecule.

The above-described aspects of the invention address the shortcomings of the prior art by providing an ability to precisely manufacture extremely small features given modern nano-fabrication techniques where dimensions range from several micrometers to tens of nanometers. Further the described approach improves resolution through interleaving adjacent electrodes in an "offset" format thereby enabling a much finer level of control.

These interleaved adjacent electrodes are used in combination to create a field to attract a molecule based upon the macro-molecular dipole of the molecule. This can be used for example with, for example, deoxyadenosine triphosphate to manipulate the molecule. The molecule may be held in placed, rotated, or moved about the surface of the semiconductor structure.

Embodiments of the invention provide a precisely manufactured nano-scale 3D structure that provides side-of-channel-based electro kinetic-control of individual molecules using the dipoles inherent in the subject material. Further, embodiments of the invention provide an example manufacturing process for the aforementioned structure, as well as control definition of the use of the described structure using applied electric fields to manipulate the subject material within the channel.

The described aspects of embodiments of the invention take advantage of advanced patterning that allows placement of electrodes for field generation at precise locations at the molecular scale. In addition, aspects of embodiments of the invention utilize advanced etching techniques for the precise placement and sizing of a nanoscale channel. When embodiments of the invention are put into use, the embodiments facilitate application of a field selectively to portions of a molecule that will orient and/or move the molecule in the channel. Individual electrodes in embodiments of the invention are controlled individually and intelligently. This is accomplished through the use of offset fields generated by the semiconductor structure of embodiments of the invention.

Turning now to a more detailed description of aspects of the present invention, FIG. 1 depicts a cross-sectional view of a semiconductor structure after a processing operation according to one or more embodiments of the present invention. The starting structure can be conventionally fabricated, for example, using known processes and techniques. Also, unless noted otherwise, conventional processes described herein can be used to achieve individual stages of the fabrication process described. A substrate 110 is provided that can include, for example, silicon, glass, ceramic, or polymers. A silicon oxide mandrel 120 including a sacrificial material is patterned to form pillars. The sacrificial material can be any suitable sacrificial material, for example, an organic polymer.

Figure 2:
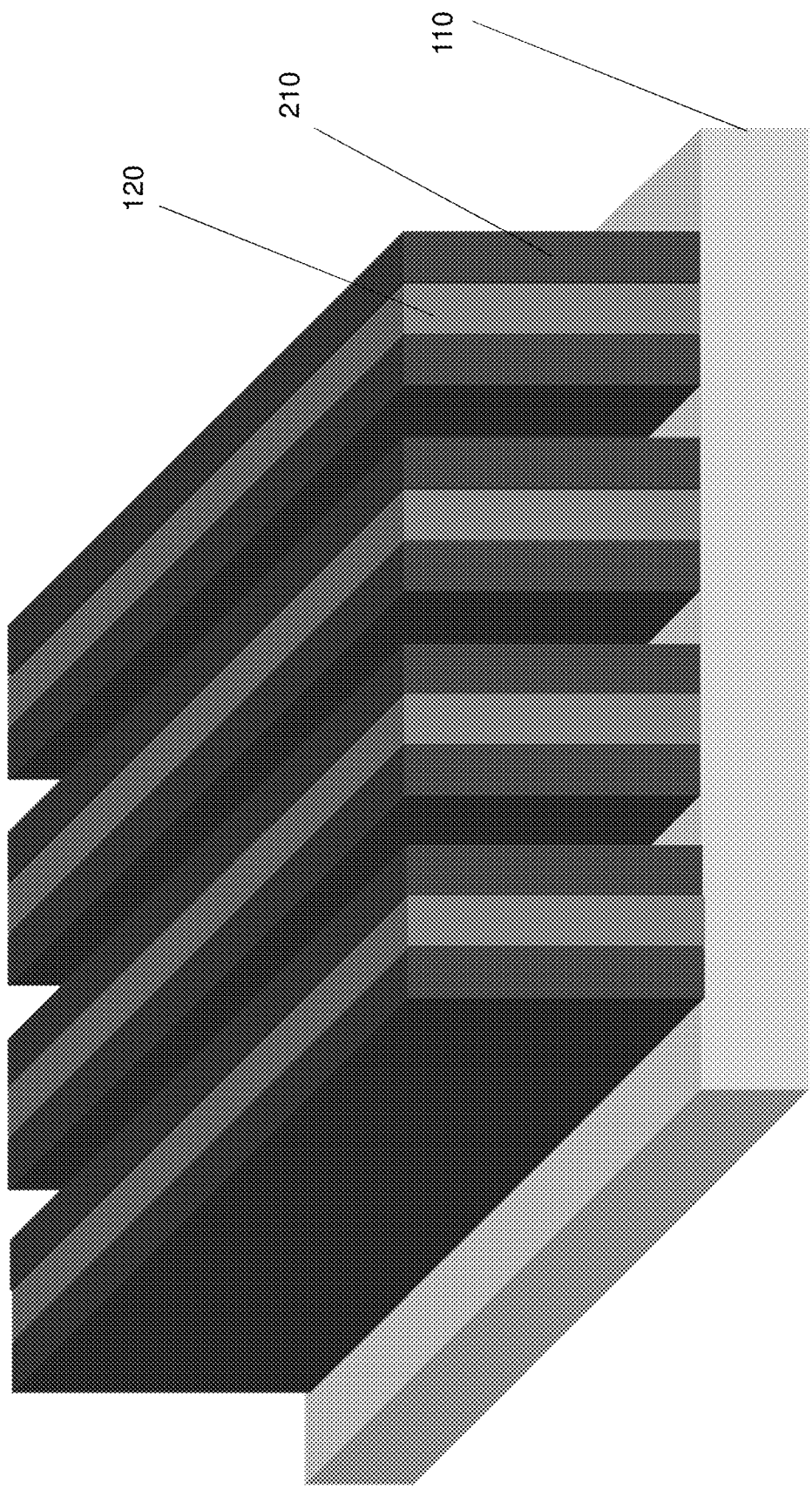
FIG. 2 depicts a cross-sectional view of a semiconductor structure after a processing operation according to one or more embodiments of the present invention.

FIG. 2 depicts a cross-sectional view of a semiconductor structure after a processing operation according to one or more embodiments of the present invention. Spacers 210 are formed on the sidewalls of mandrel 120. Spacers 210 can include silicon nitride, for example. Spacers 210 are formed by a two-step process. A conformal deposition of silicon nitride, using, for example, chemical vapor deposition ("CVD") or atomic layer deposition ("ALD"), is performed on exposed surfaces of the substrate 110 and mandrel 120. This is followed by a directional resistive ion etch ("ME").

Figure 3:
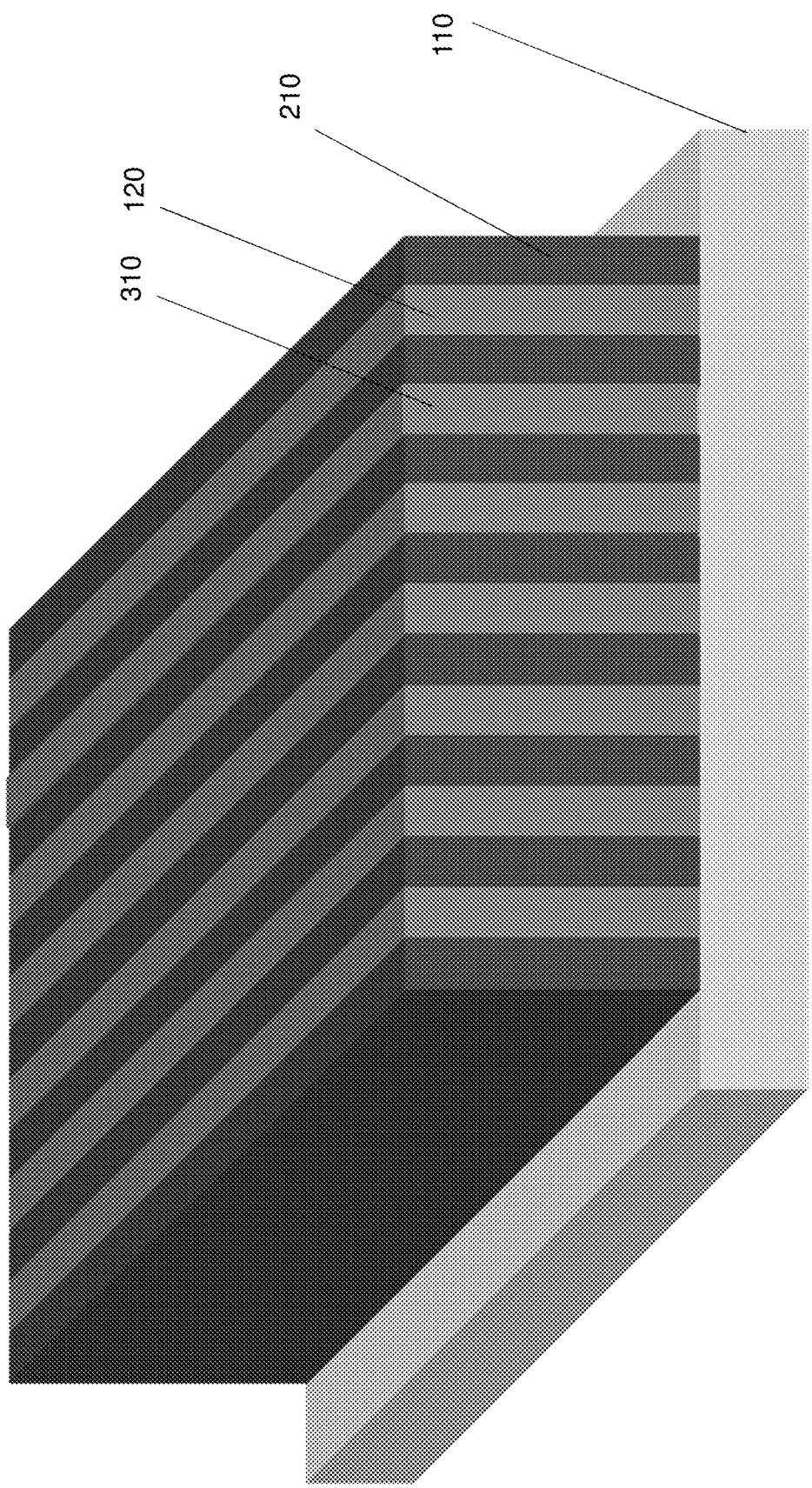
FIG. 3 depicts a cross-sectional view of a semiconductor structure after a processing operation according to one or more embodiments of the present invention.

FIG. 3 depicts a cross-sectional view of a semiconductor structure after a processing operation according to one or more embodiments of the present invention. The gaps between the spacers 210 is filled with the same material 310 as the original mandrel 120 material. In some embodiments, this is performed through ALD or CVD deposition followed by planarization (e.g., chemical mechanical polish (CMP)). Alternatively, the gap fill can be done by other deposition techniques such as spin-on coating. This forms alternating mandrel 120 and nitride spacer 210 patterns. If needed, the above-described mandrel/spacer process can be repeated to achieve dense patterning. For example, the patterning pitch can be 20 nm with the width of each pillar of the mandrel 120 and spacers 210 being 10 nm.

Figure 4:
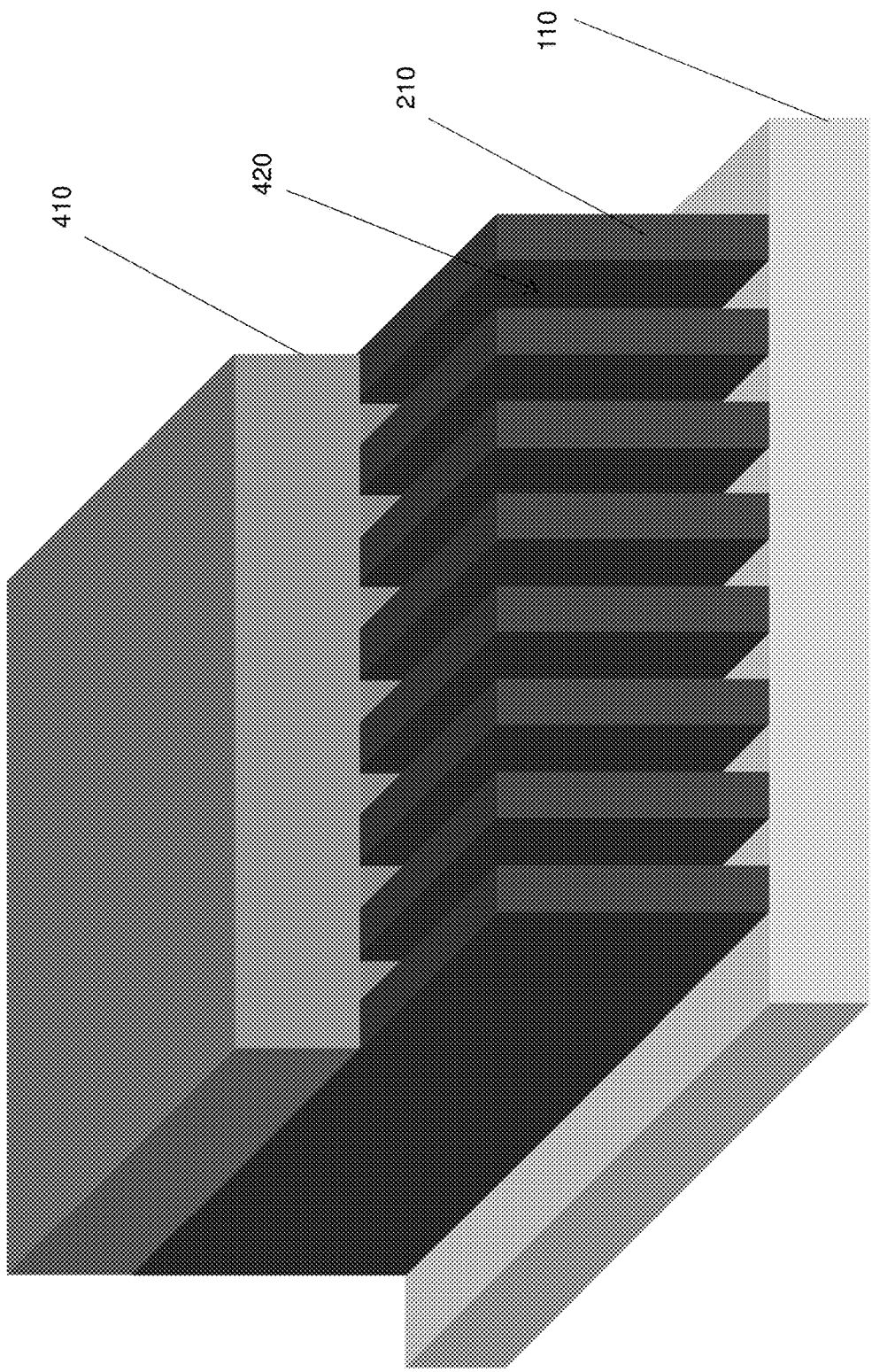
FIG. 4 depicts a cross-sectional view of a semiconductor structure after a processing operation according to one or more embodiments of the present invention.

FIG. 4 depicts a cross-sectional view of a semiconductor structure after a processing operation according to one or more embodiments of the present invention. A mask 410 including, for example, amorphous carbon, is formed to cover a portion of the interleaved spacers 210 and mandrel 120. The mask 410 can be formed by a variety of patterning techniques. For example, the mask 410 can be formed by first depositing the mask layer 410 followed by lithography. An etch process such as reactive ion etch (ME) is performed to remove the exposed silicon oxide in the region not covered by mask 410. This creates gaps 420 between the spacers 210.

Figure 5:
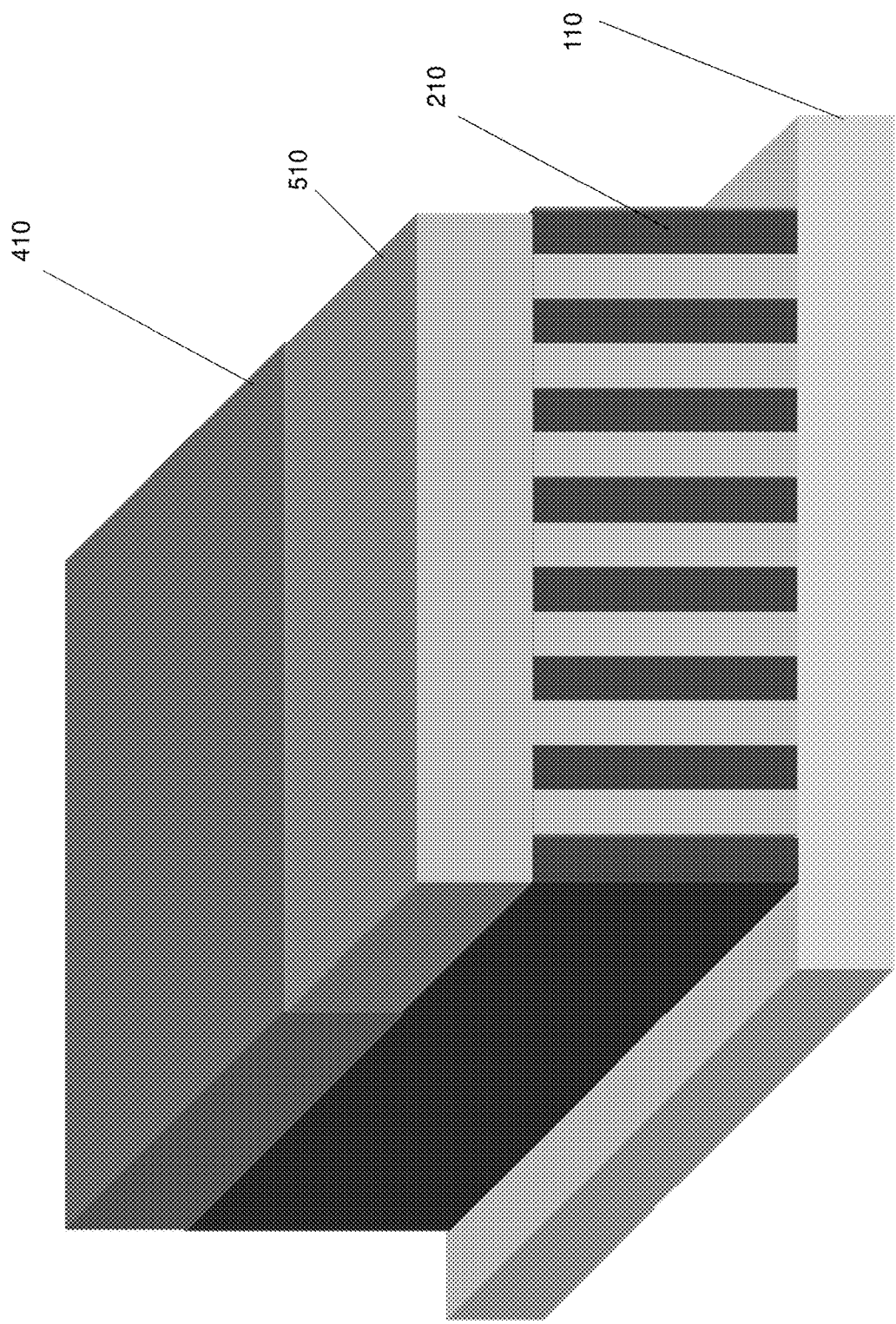
FIG. 5 depicts a cross-sectional view of a semiconductor structure after a processing operation according to one or more embodiments of the present invention.

FIG. 5 depicts a cross-sectional view of a semiconductor structure after a processing operation according to one or more embodiments of the present invention. Amorphous silicon 510 is deposited by, for example, CVD or ALD to fill the gaps between the spacers 210, which is then planarized to the top of the mask 410. The amorphous silicon 510 serves as a mask layer in the subsequent process steps. The amorphous silicon mask layer 510 is formed self-aligned to the mask layer 410 as it is complementary to the mask layer 410. The mask layer 510 can be formed without lithography.

Figure 6:
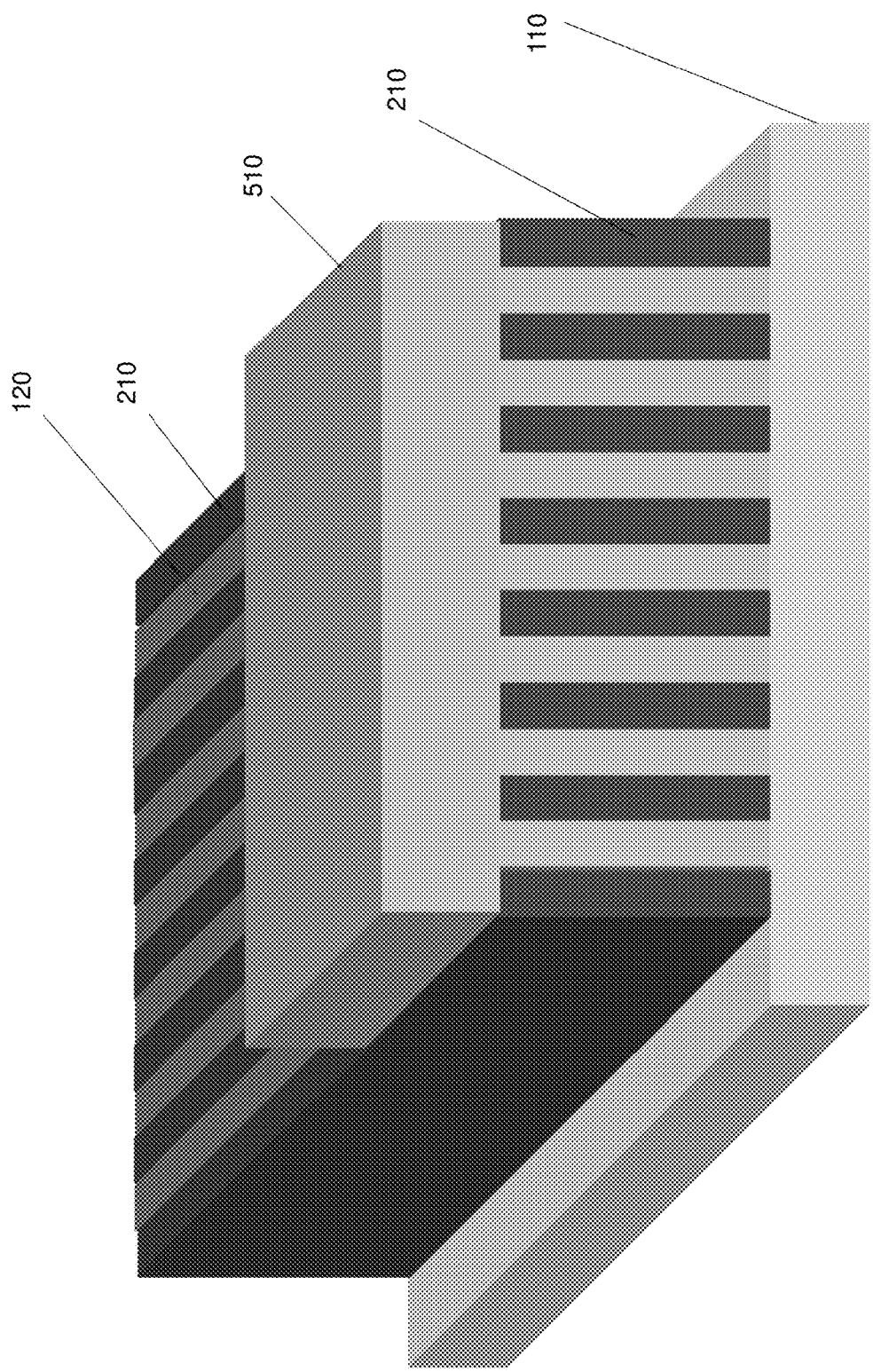
FIG. 6 depicts a cross-sectional view of a semiconductor structure after a processing operation according to one or more embodiments of the present invention.

FIG. 6 depicts a cross-sectional view of a semiconductor structure after a processing operation according to one or more embodiments of the present invention. Using oxygen etching or chemical etching, for example, the mask 410 (not shown in this figure) is removed, exposing the mandrel 120/spacers 210 interleaved structure.

Figure 7:
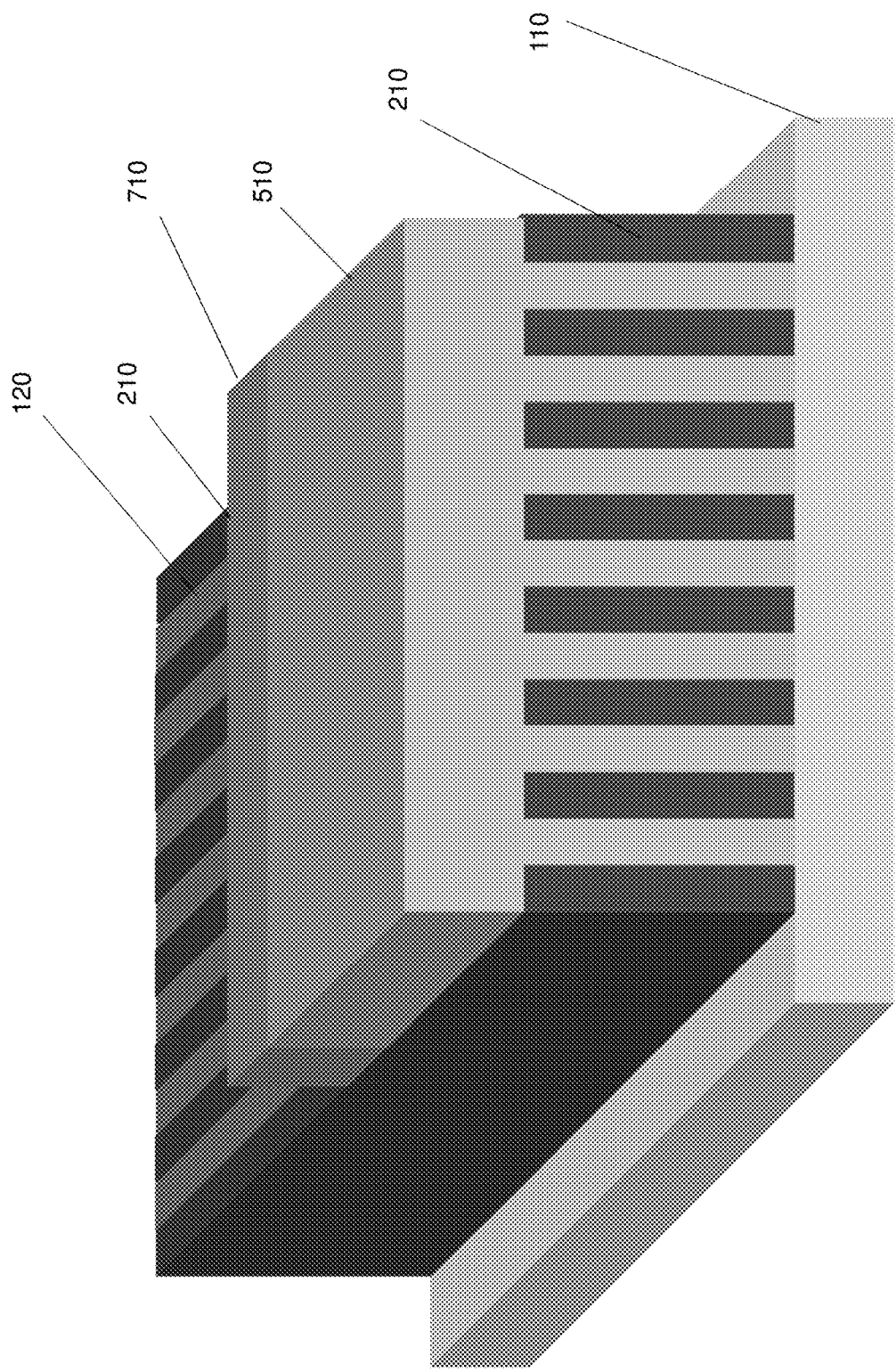
FIG. 7 depicts a cross-sectional view of a semiconductor structure after a processing operation according to one or more embodiments of the present invention.

FIG. 7 depicts a cross-sectional view of a semiconductor structure after a processing operation according to one or more embodiments of the present invention. A spacer 710, for example, amorphous carbon, is formed on the sidewall of the amorphous silicon 510. The amorphous carbon spacer 710 defines a channel which will be formed later. Due to a deposition followed by an etching to form the amorphous carbon spacer 710, the top of the amorphous carbon spacer 710 and the top of the amorphous silicon 510 need not be coplanar.

Figure 8:
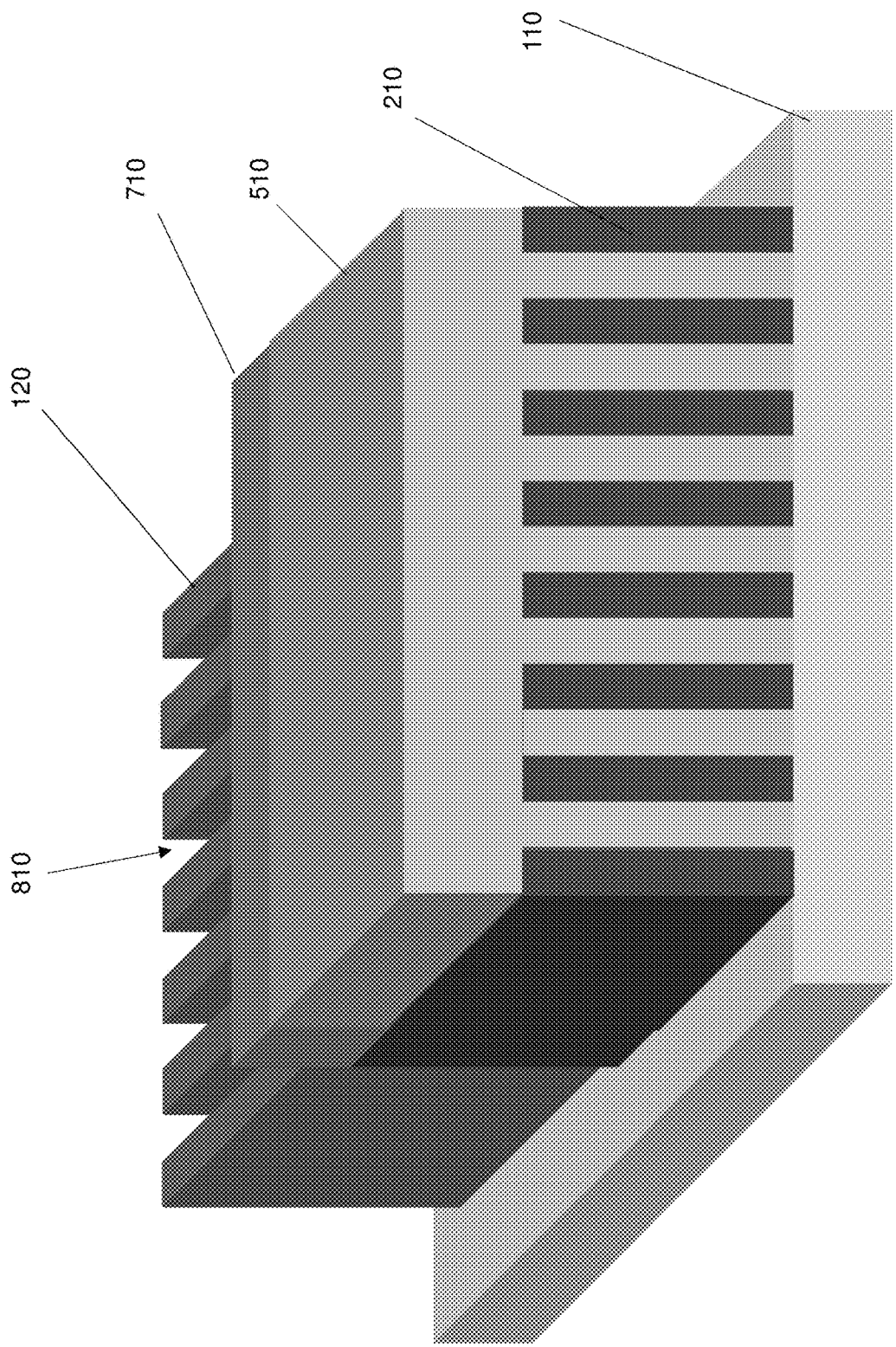
FIG. 8 depicts a cross-sectional view of a semiconductor structure after a processing operation according to one or more embodiments of the present invention.

FIG. 8 depicts a cross-sectional view of a semiconductor structure after a processing operation according to one or more embodiments of the present invention. A directional etch, such as by RIE, is performed to remove the exposed nitride spacers between the pillars of the mandrel 120. This creates gaps 810 between the oxide pillars of the mandrel 120. In the course of this directional etch, some amorphous silicon 510 can be removed, but this does not affect the process if some removal occurs.

Figure 9:
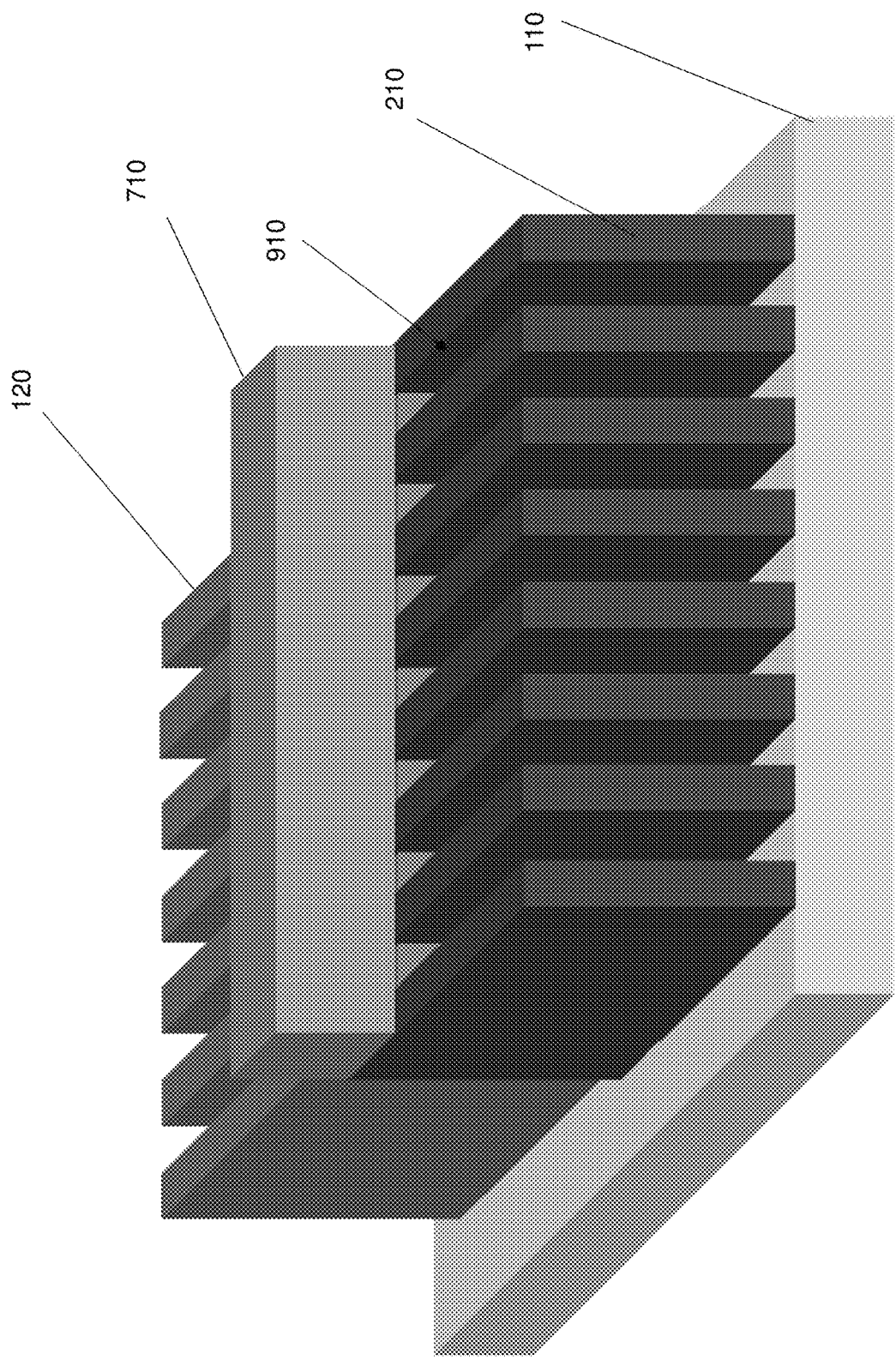
FIG. 9 depicts a cross-sectional view of a semiconductor structure after a processing operation according to one or more embodiments of the present invention.

FIG. 9 depicts a cross-sectional view of a semiconductor structure after a processing operation according to one or more embodiments of the present invention. The amorphous silicon 510 (not shown) can be removed for example, by using an aqueous solution containing ammonium hydroxide (ammonia), tetramethylammonium hydroxide (TMAH), hydrazine, or ethylene diamine pyrocatechol (EDP). Alternatively, plasma dry etch can be used. This leaves gaps 910 between the spacers 210.

Figure 10:
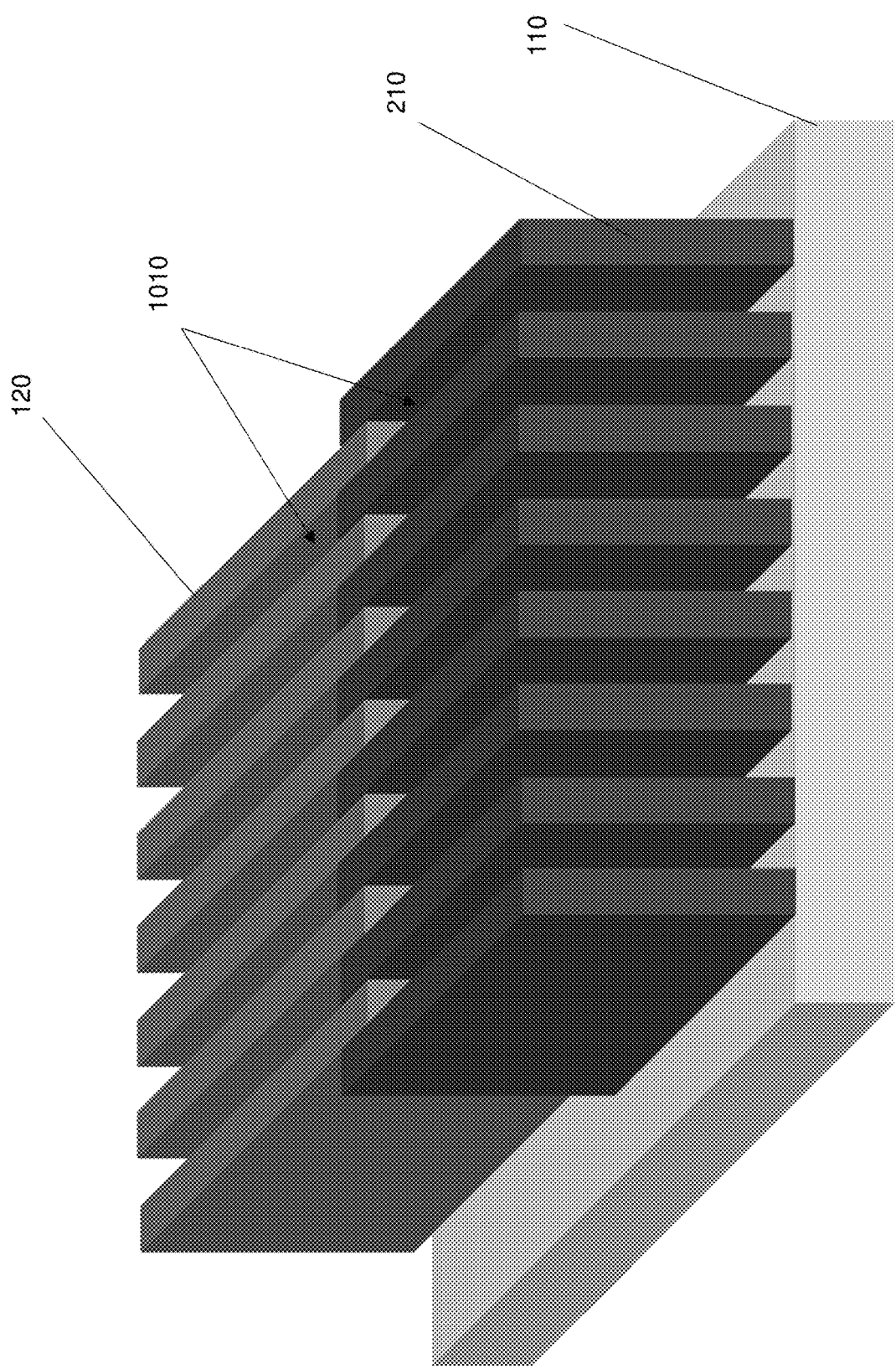
FIG. 10 depicts a cross-sectional view of a semiconductor structure after a processing operation according to one or more embodiments of the present invention.

FIG. 10 depicts a cross-sectional view of a semiconductor structure after a processing operation according to one or more embodiments of the present invention. This figure has the amorphous carbon spacer 710 not shown in order to demonstrate the offset trenches 1010 that will eventually be filled with a conductor to form an offset array.

Figure 11:
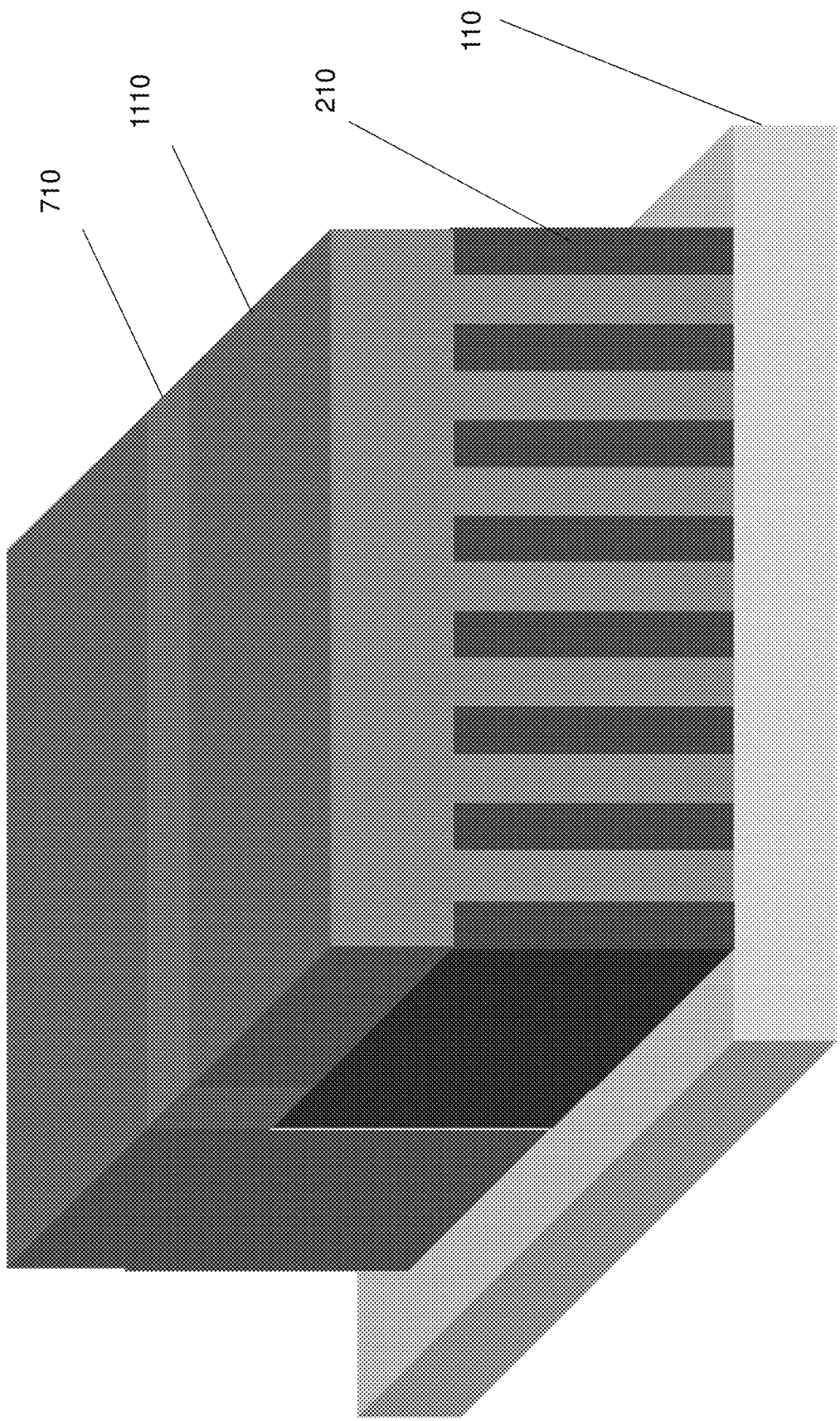
FIG. 11 depicts a cross-sectional view of a semiconductor structure after a processing operation according to one or more embodiments of the present invention.

FIG. 11 depicts a cross-sectional view of a semiconductor structure after a processing operation according to one or more embodiments of the present invention. The offset trenches 1010 are filled with a conductor 1110, for example, tungsten. Conductor materials: tungsten (W), aluminum (Al), copper (Cu), cobalt (Co), nickel (Ni), titanium (Ti), ruthenium (Ru), molybdenum (Mo), or any other suitable conductive material. The metal contact can further include a liner layer (not shown). The liner layer, if present, can be titanium nitride (TiN), tantalum nitride (TaN), hafnium nitride (HfN), niobium nitride (NbN), tungsten nitride (WN), tungsten carbon nitride (WCN), or combinations thereof, where the liner layer can serve as an adhesion layer and facilitate filling the trenches with more conducting materials. The conductor 1110 is then planarized with chemical mechanical polish, stopping on top of the amorphous carbon spacer 710

Figure 12:
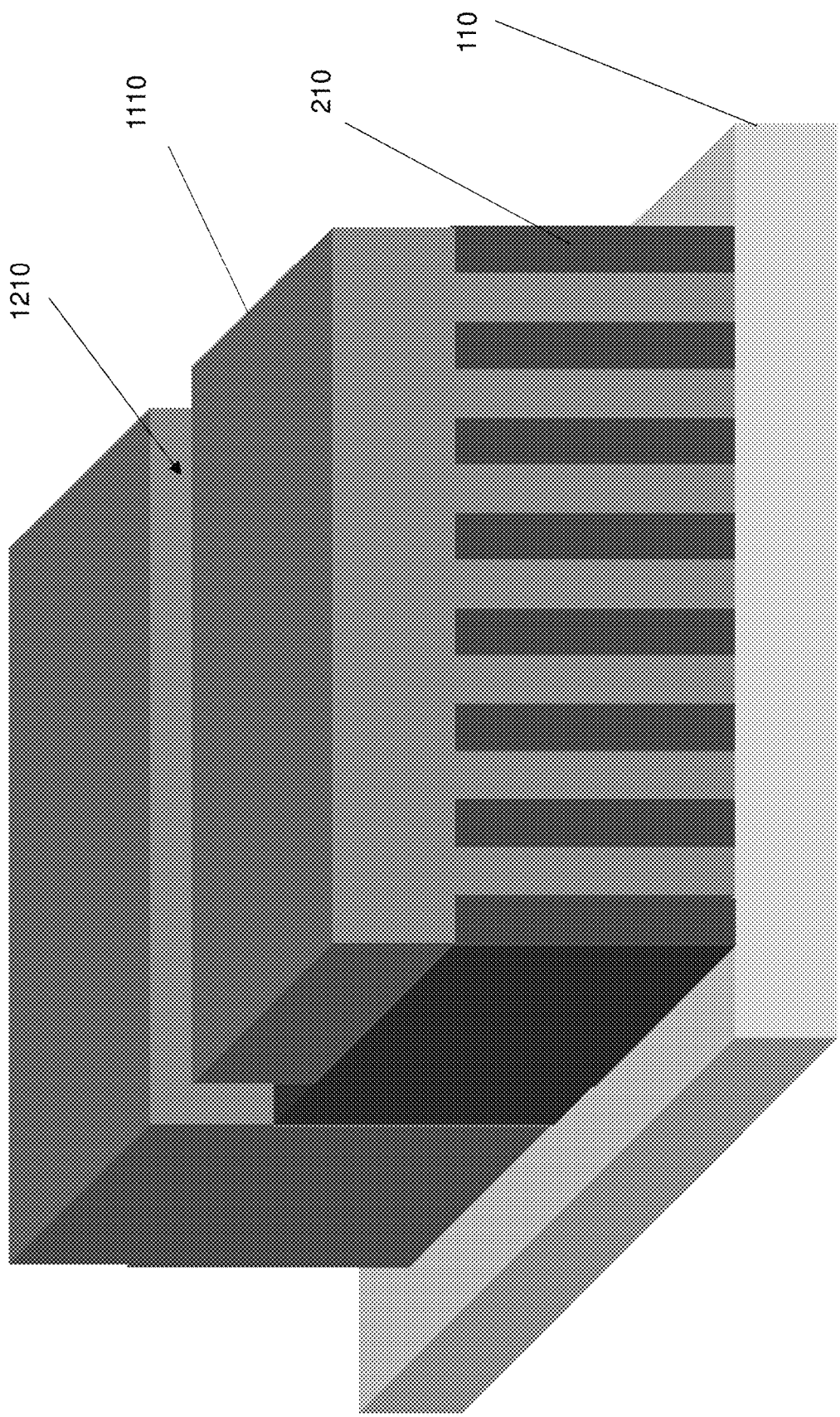
FIG. 12 depicts a cross-sectional view of a semiconductor structure after a processing operation according to one or more embodiments of the present invention.

FIG. 12 depicts a cross-sectional view of a semiconductor structure after a processing operation according to one or more embodiments of the present invention. The amorphous carbon spacer 710 (not shown) is removed through, for example, an oxygen etch to define a channel 1210.

Figure 13:
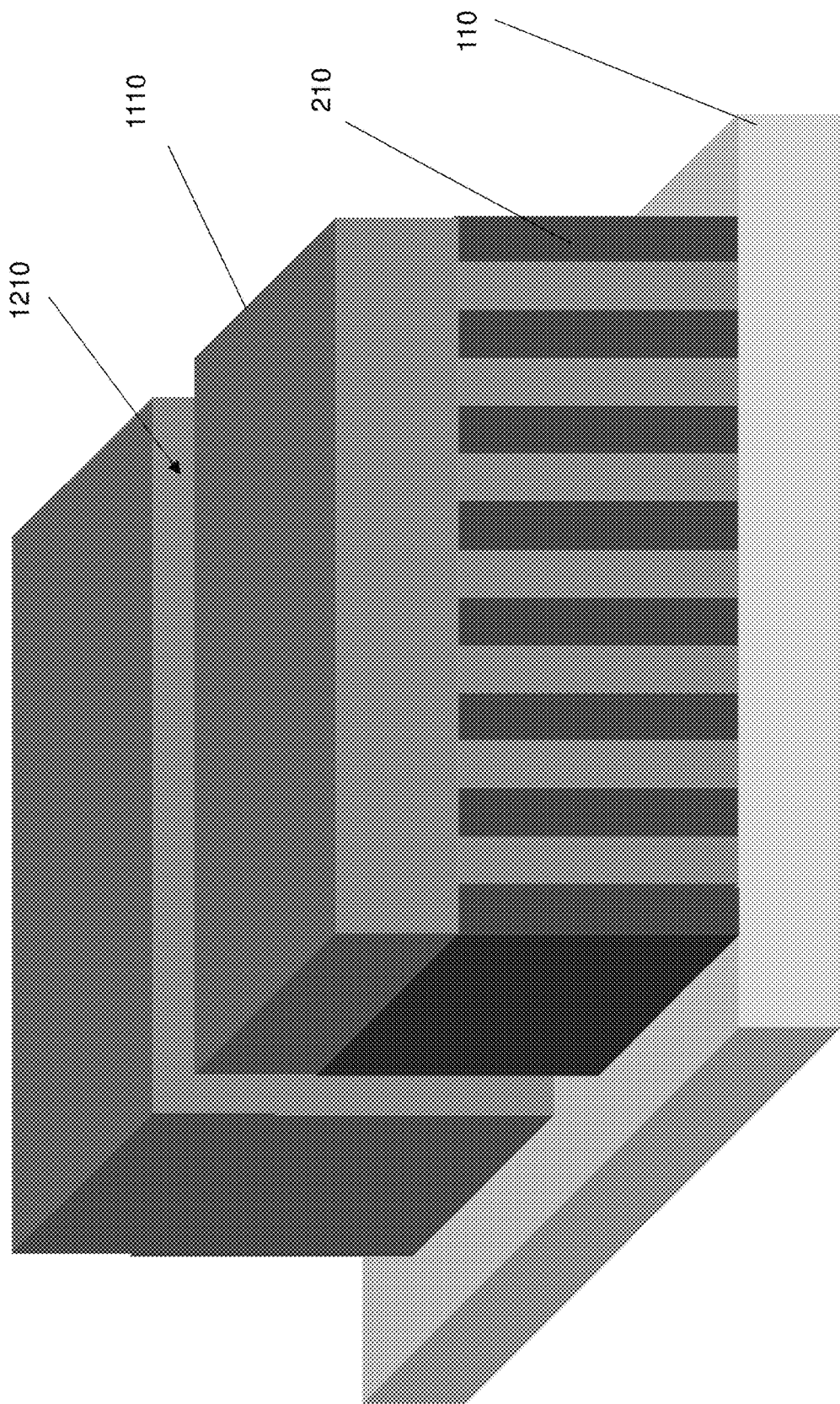
FIG. 13 depicts a cross-sectional view of a semiconductor structure after a processing operation according to one or more embodiments of the present invention.

FIG. 13 depicts a cross-sectional view of a semiconductor structure after a processing operation according to one or more embodiments of the present invention. The pillars of the mandrel 120 and the pillars of the spacers 210 are removed in the channel region 1210 by a directional etching using RIE. In some embodiments, the directional etching is selective to the conductor 1110.

Figure 14:
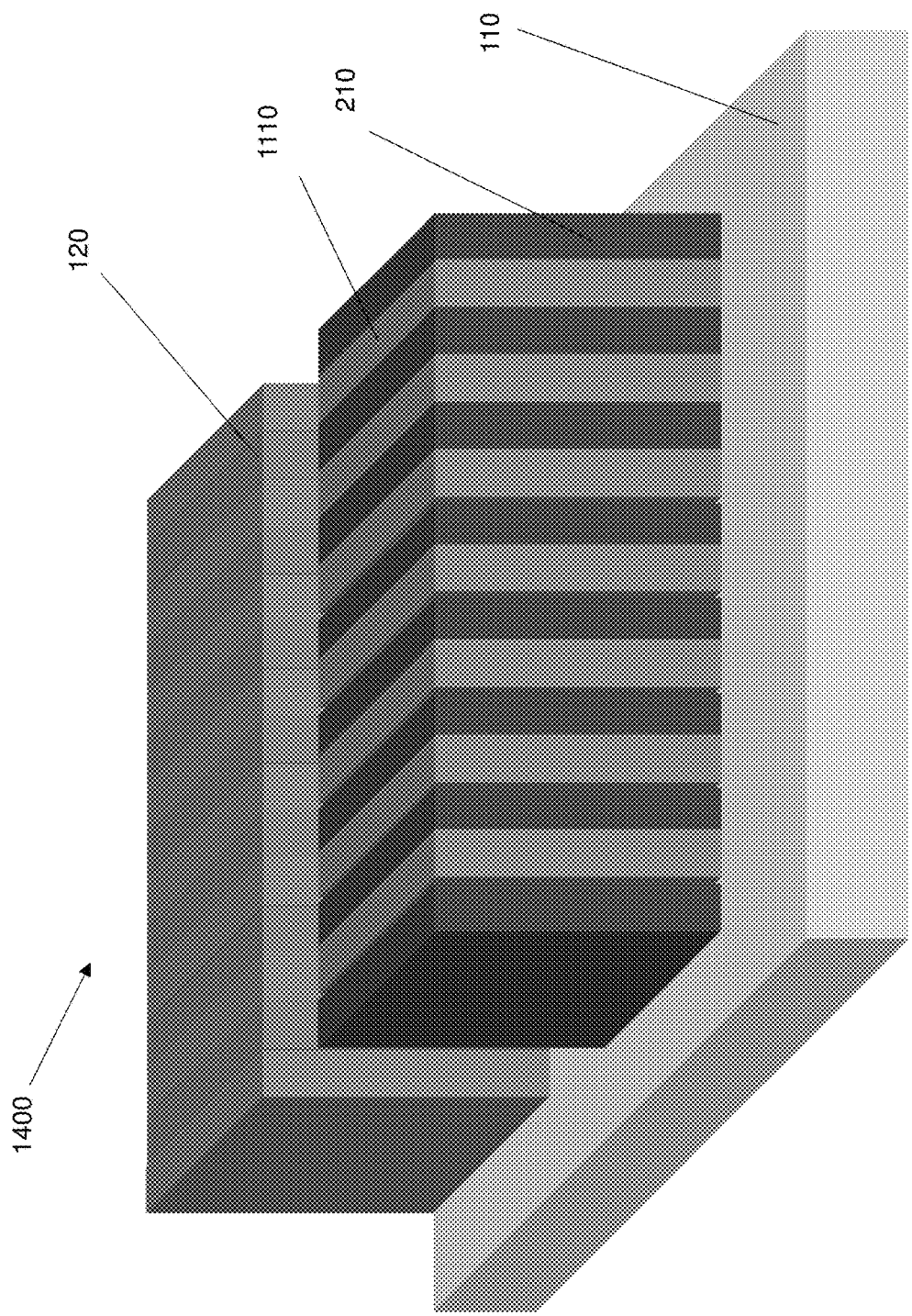
FIG. 14 depicts a cross-sectional view of a semiconductor structure after a processing operation according to one or more embodiments of the present invention.

FIG. 14 depicts a cross-sectional view of a semiconductor structure after a processing operation according to one or more embodiments of the present invention. The remaining conductor 1110 is recessed to form recessed conductor arrays that are offset by a gap distance forming a final semiconductor structure 1400.

Figure 15:
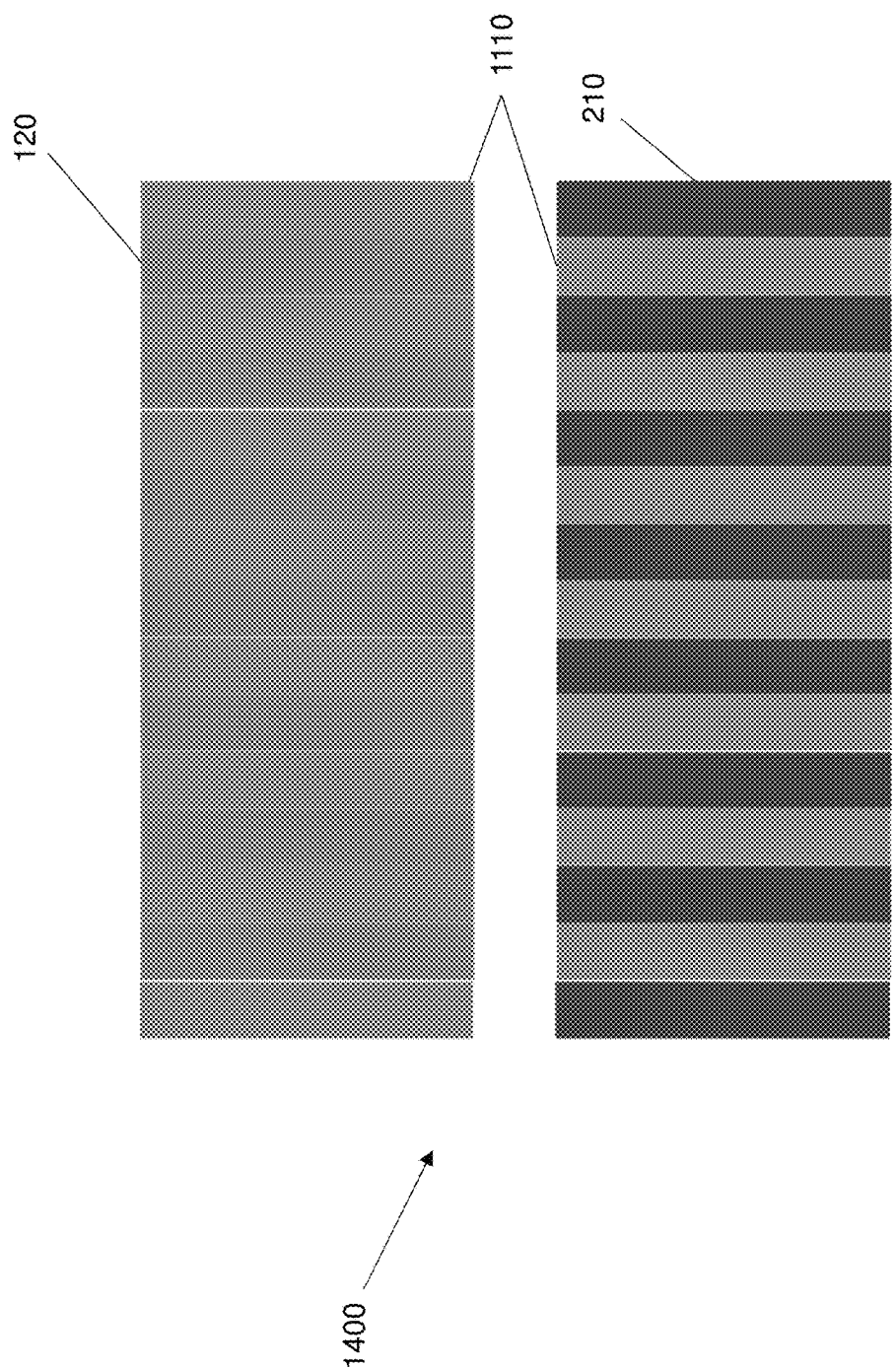
FIG. 15 depicts a top-down view of a semiconductor structure after a processing operation according to one or more embodiments of the present invention.

FIG. 15 depicts a top-down view of a semiconductor structure after a processing operation according to one or more embodiments of the present invention. The top-down view omits the substrate, so that the reader can easily see the interleaved conductors 1110 that are offset by a gap distance.

Figure 16:
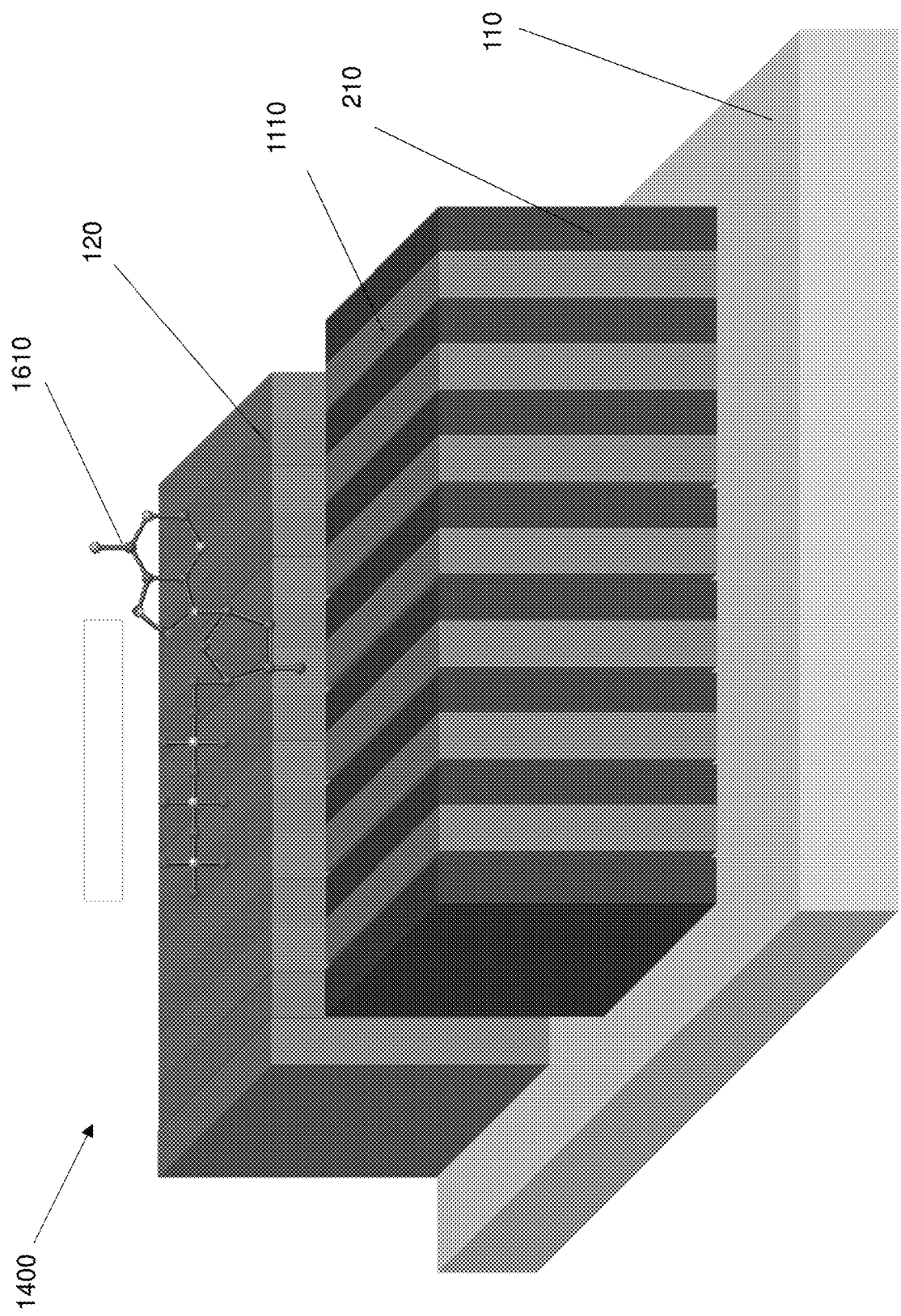
FIG. 16 depicts a cross-sectional view of a semiconductor structure after a processing operation according to one or more embodiments of the present invention.

FIG. 16 depicts a cross-sectional view of a semiconductor structure after a processing operation according to one or more embodiments of the present invention. The final semiconductor structure 1400 improves resolution through interleaving adjacent electrodes in this offset format, enabling a much finer level of control than previously available. These interleaved adjacent electrodes are used in combination to create a field to manipulate a molecule, such as molecule 1610, based upon the macro-molecular dipole of the molecule. In some embodiments, an analyte containing interested molecules can flow in the channel. A variety of electrical voltages can be applied to the array of the interleaved electrodes to manipulate molecules in the channel.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, ALD among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage.

By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" can include any integer number greater than or equal to one, i.e. one, two, three, four, etc. The terms "a plurality" can include any integer number greater than or equal to two, i.e. two, three, four, five, etc. The term "connection" can include both an indirect "connection" and a direct "connection."

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method for forming a semiconductor structure, the method comprising:
    forming a plurality of mandrels comprising first pillars of a first material on a substrate, the mandrels extending from a surface of the substrate in a first direction;
    depositing first spacers comprising a second material along sidewalls of the mandrels;
    depositing second spacers comprising the first material between the first spacers;
    removing portions of the mandrels and portions of the second spacers comprising the first material from a first portion of the structure to define first gaps;
    removing portions of the first spacers comprising the second material from a second portion of the structure to define second gaps, wherein the first gaps are offset from the second gaps in a second direction orthogonal to the first direction;
    depositing a conductor in the first gaps and the second gaps to define a first array of conductive fins offset from a second array of conductive fins; and
    exposing the surface of the substrate to define a channel between the first array of conductive fins and the second array of conductive fins.

2. The method of claim 1, wherein the mandrels first pillars are formed by depositing the first material on the substrate, patterning the first material, and etching the first material.

3. The method of claim 1, wherein the first spacers are formed by conformally depositing the second material around the mandrels first pillars and substrate and directionally etching the second material from the substrate.

4. The method of claim 1, wherein removing the first material from a first portion of the structure forming first gaps further comprises forming a mask layer over the second portion of the structure and performing an etching operation to remove exposed first material from the first potion of the structure.

5. The method of claim 4, wherein removing the second material from a second portion of the structure further comprises forming a mask layer over the first portion of the structure and performing an etching operation to remove exposed second material from the second potion of the structure.

6. The method of claim 4, wherein the mask layer comprises amorphous carbon.

7. The method of claim 6, wherein the mask layer comprises amorphous silicon formed self-aligned to the amorphous carbon mask layer.

8. The method of claim 4 further comprising depositing a second channel spacer on the sidewall of the mask.

9. The method of claim 8, wherein the wherein the second spacer comprises amorphous carbon.

10. The method of claim 1, wherein the first material comprises a sacrificial material.

11. The method of claim 1, wherein the second material comprises a nitride.

12. The method of claim 1, wherein the conductor comprises tungsten.

13. The method of claim 1, wherein depositing a conductor in the first gaps and the second gaps further comprises filling the first and second gaps with the conductor and planarizing the conductor.

* * * * *